US009625272B2

(12) United States Patent
Tao et al.

(10) Patent No.: US 9,625,272 B2
(45) Date of Patent: Apr. 18, 2017

(54) MEMS QUADRATURE CANCELLATION AND SIGNAL DEMODULATION

(71) Applicant: Fairchild Semiconductor Corporation, San Jose, CA (US)

(72) Inventors: Hai Tao, Sunnyvale, CA (US); Ion Opris, San Jose, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 1043 days.

(21) Appl. No.: 13/860,780

(22) Filed: Apr. 11, 2013

(65) Prior Publication Data
US 2013/0269413 A1 Oct. 17, 2013

Related U.S. Application Data

(60) Provisional application No. 61/623,423, filed on Apr. 12, 2012.

(51) Int. Cl.
*G01C 25/00* (2006.01)
*B81B 7/02* (2006.01)
(Continued)

(52) U.S. Cl.
CPC .......... *G01C 25/00* (2013.01); *B81B 7/02* (2013.01); *G01C 19/5776* (2013.01); *G01P 15/097* (2013.01)

(58) Field of Classification Search
CPC ... G01P 15/097; G01C 19/5776; G01C 25/00; B81B 7/02
See application file for complete search history.

(56) References Cited

U.S. PATENT DOCUMENTS 3,231,729 A    1/1966  Stern
4,511,848 A *  4/1985  Watson ............... H03D 1/2245
                                                        329/349
(Continued)

FOREIGN PATENT DOCUMENTS

CN    1068444 A    1/1993
CN    1198587 A    11/1998
(Continued)

OTHER PUBLICATIONS

Explanation of phase shifters from "Microwaves 101" website downloaded Aug. 4, 2016.*
(Continued)

*Primary Examiner* — Natalie Huls
(74) *Attorney, Agent, or Firm* — Schwegman Lundberg & Woessner, P.A.

(57) ABSTRACT

In certain examples, a quadrature cancellation apparatus can include a drive charge amplifier configured to couple to a proof mass of a MEMS device and to provide oscillation motion information, a first sense charge amplifier configured to couple to the proof mass and to provide first sense information of a first movement of the MEMS device, a first programmable amplifier configured to receive the oscillation motion information and provide amplified oscillation motion information, a first summer configured to cancel quadrature error of the first sense information using the first sense information and the amplified oscillation motion information to provide quadrature-corrected first sense information, a phase shifter configured to receive the oscillation motion information and to provide carrier information, and a first multiplier configured to provide demodulated first sense information using the quadrature-corrected first sense information and the carrier information.

3 Claims, 2 Drawing Sheets

(51) Int. Cl.
  *G01C 19/5776* (2012.01)
  *G01P 15/097* (2006.01)

(56) References Cited

U.S. PATENT DOCUMENTS

| | | | |
|---|---|---|---|
| 4,896,156 A | 1/1990 | Garverick | |
| 5,481,914 A | 1/1996 | Ward | |
| 5,487,305 A | 1/1996 | Ristic et al. | |
| 5,491,604 A | 2/1996 | Nguyen et al. | |
| 5,600,064 A | 2/1997 | Ward | |
| 5,656,778 A | 8/1997 | Roszhart | |
| 5,659,195 A | 8/1997 | Kaiser et al. | |
| 5,703,292 A * | 12/1997 | Ward | H03F 1/083 |
| | | | 73/504.02 |
| 5,723,790 A | 3/1998 | Andersson | |
| 5,751,154 A | 5/1998 | Tsugai | |
| 5,760,465 A | 6/1998 | Alcoe et al. | |
| 5,765,046 A | 6/1998 | Watanabe et al. | |
| 5,894,091 A | 4/1999 | Kubota | |
| 5,912,499 A | 6/1999 | Diem et al. | |
| 5,992,233 A * | 11/1999 | Clark | G01C 19/5719 |
| | | | 361/280 |
| 6,131,457 A | 10/2000 | Sato | |
| 6,214,644 B1 | 4/2001 | Glenn | |
| 6,230,566 B1 | 5/2001 | Lee et al. | |
| 6,236,096 B1 | 5/2001 | Chang et al. | |
| 6,250,157 B1 | 6/2001 | Touge | |
| 6,253,612 B1 | 7/2001 | Lemkin et al. | |
| 6,301,965 B1 | 10/2001 | Chu et al. | |
| 6,351,996 B1 | 3/2002 | Nasiri et al. | |
| 6,366,468 B1 | 4/2002 | Pan | |
| 6,370,937 B2 * | 4/2002 | Hsu | G01C 19/56 |
| | | | 73/1.37 |
| 6,390,905 B1 | 5/2002 | Korovin et al. | |
| 6,501,282 B1 | 12/2002 | Dummermuth et al. | |
| 6,504,385 B2 | 1/2003 | Hartwell | |
| 6,516,651 B1 | 2/2003 | Geen | |
| 6,553,835 B1 | 4/2003 | Hobbs et al. | |
| 6,629,448 B1 | 10/2003 | Cvancara | |
| 6,654,424 B1 | 11/2003 | Thomae et al. | |
| 6,664,941 B2 | 12/2003 | Itakura et al. | |
| 6,722,206 B2 | 4/2004 | Takada | |
| 6,725,719 B2 | 4/2004 | Cardarelli | |
| 6,737,742 B2 | 5/2004 | Sweterlitsch | |
| 6,781,231 B2 | 8/2004 | Minervini et al. | |
| 6,848,304 B2 | 2/2005 | Geen | |
| 7,051,590 B1 * | 5/2006 | Lemkin | G01C 19/5719 |
| | | | 73/504.04 |
| 7,054,778 B2 | 5/2006 | Geiger et al. | |
| 7,093,487 B2 | 8/2006 | Mochida | |
| 7,166,910 B2 | 1/2007 | Minervini et al. | |
| 7,173,402 B2 | 2/2007 | Chen et al. | |
| 7,202,552 B2 | 4/2007 | Zhe et al. | |
| 7,210,351 B2 | 5/2007 | Lo et al. | |
| 7,216,525 B2 * | 5/2007 | Schroeder | G01C 19/56 |
| | | | 73/1.77 |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie et al. | |
| 7,266,349 B2 | 9/2007 | Kappes | |
| 7,293,460 B2 | 11/2007 | Zarabadi et al. | |
| 7,301,212 B1 | 11/2007 | Mian et al. | |
| 7,305,880 B2 | 12/2007 | Caminada et al. | |
| 7,339,384 B2 | 3/2008 | Peng et al. | |
| 7,358,151 B2 | 4/2008 | Araki et al. | |
| 7,436,054 B2 | 10/2008 | Zhe | |
| 7,444,869 B2 | 11/2008 | Johnson et al. | |
| 7,449,355 B2 | 11/2008 | Lutz et al. | |
| 7,451,647 B2 | 11/2008 | Matsuhisa et al. | |
| 7,454,967 B2 | 11/2008 | Skurnik | |
| 7,481,110 B2 * | 1/2009 | Handrich | G01C 19/5726 |
| | | | 73/504.12 |
| 7,518,493 B2 | 4/2009 | Bryzek et al. | |
| 7,539,003 B2 | 5/2009 | Ray | |
| 7,544,531 B1 | 6/2009 | Grosjean | |
| 7,565,839 B2 * | 7/2009 | Stewart | G01C 19/56 |
| | | | 73/504.12 |
| 7,595,648 B2 | 9/2009 | Ungaretti et al. | |
| 7,600,428 B2 | 10/2009 | Robert et al. | |
| 7,616,078 B2 | 11/2009 | Prandi et al. | |
| 7,622,782 B2 | 11/2009 | Chu et al. | |
| 7,694,563 B2 | 4/2010 | Durante et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,817,331 B2 | 10/2010 | Moidu | |
| 7,851,925 B2 | 12/2010 | Theuss et al. | |
| 7,859,352 B2 | 12/2010 | Sutton | |
| 7,950,281 B2 | 5/2011 | Hammerschmidt | |
| 7,965,067 B2 | 6/2011 | Grönthal et al. | |
| 8,004,354 B1 | 8/2011 | Pu et al. | |
| 8,006,557 B2 | 8/2011 | Yin et al. | |
| 8,026,771 B2 | 9/2011 | Kanai et al. | |
| 8,037,755 B2 | 10/2011 | Nagata et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,256,290 B2 | 9/2012 | Mao | |
| 8,375,789 B2 | 2/2013 | Prandi et al. | |
| 8,378,756 B2 | 2/2013 | Huang et al. | |
| 8,421,168 B2 | 4/2013 | Allen et al. | |
| 8,476,970 B2 | 7/2013 | Mokhtar et al. | |
| 8,497,746 B2 | 7/2013 | Visconti et al. | |
| 8,508,290 B2 | 8/2013 | Elsayed et al. | |
| 8,643,382 B2 | 2/2014 | Steele et al. | |
| 8,661,898 B2 * | 3/2014 | Watson | G01C 19/5691 |
| | | | 73/504.08 |
| 8,710,599 B2 | 4/2014 | Marx et al. | |
| 8,739,626 B2 | 6/2014 | Acar | |
| 8,742,964 B2 | 6/2014 | Kleks et al. | |
| 8,754,694 B2 | 6/2014 | Opris et al. | |
| 8,763,459 B2 | 7/2014 | Brand et al. | |
| 8,813,564 B2 | 8/2014 | Acar | |
| 8,978,475 B2 | 3/2015 | Acar | |
| 9,003,882 B1 | 4/2015 | Ayazi et al. | |
| 9,006,846 B2 | 4/2015 | Bryzek et al. | |
| 9,052,335 B2 * | 6/2015 | Coronato | G01C 19/56 |
| 9,062,972 B2 | 6/2015 | Acar et al. | |
| 9,069,006 B2 | 6/2015 | Opris et al. | |
| 9,094,027 B2 | 7/2015 | Tao et al. | |
| 9,095,072 B2 | 7/2015 | Bryzek et al. | |
| 9,156,673 B2 | 10/2015 | Bryzek et al. | |
| 9,246,018 B2 | 1/2016 | Acar | |
| 9,278,845 B2 | 3/2016 | Acar | |
| 9,278,846 B2 | 3/2016 | Acar et al. | |
| 9,352,961 B2 | 5/2016 | Acar et al. | |
| 2001/0022106 A1 | 9/2001 | Kato et al. | |
| 2002/0021059 A1 | 2/2002 | Knowles et al. | |
| 2002/0083757 A1 | 7/2002 | Geen | |
| 2002/0117728 A1 | 8/2002 | Brosnihan et al. | |
| 2002/0178831 A1 | 12/2002 | Takada | |
| 2002/0189352 A1 | 12/2002 | Reeds, III et al. | |
| 2002/0196445 A1 | 12/2002 | Mcclary et al. | |
| 2003/0033850 A1 | 2/2003 | Challoner et al. | |
| 2003/0038415 A1 | 2/2003 | Anderson et al. | |
| 2003/0061878 A1 | 4/2003 | Pinson | |
| 2003/0196475 A1 * | 10/2003 | Wyse | G01C 19/5719 |
| | | | 73/1.37 |
| 2003/0200807 A1 | 10/2003 | Hulsing, II | |
| 2003/0222337 A1 | 12/2003 | Stewart | |
| 2004/0051508 A1 | 3/2004 | Hamon et al. | |
| 2004/0085096 A1 * | 5/2004 | Ward | G01P 15/08 |
| | | | 327/2 |
| 2004/0085784 A1 | 5/2004 | Salama et al. | |
| 2004/0088127 A1 | 5/2004 | M'closkey et al. | |
| 2004/0119137 A1 | 6/2004 | Leonardi et al. | |
| 2004/0177689 A1 | 9/2004 | Cho et al. | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matsuhisa | |
| 2005/0005698 A1 | 1/2005 | McNeil et al. | |

(56) References Cited

U.S. PATENT DOCUMENTS

| | | |
|---|---|---|
| 2005/0097957 A1 | 5/2005 | Mcneil et al. |
| 2005/0139005 A1 | 6/2005 | Geen |
| 2005/0189635 A1 | 9/2005 | Humpston et al. |
| 2005/0274181 A1 | 12/2005 | Kutsuna et al. |
| 2006/0032308 A1 | 2/2006 | Acar et al. |
| 2006/0034472 A1 | 2/2006 | Bazarjani et al. |
| 2006/0043608 A1 | 3/2006 | Bernier et al. |
| 2006/0097331 A1 | 5/2006 | Hattori |
| 2006/0112764 A1 | 6/2006 | Higuchi |
| 2006/0137457 A1 | 6/2006 | Zdeblick |
| 2006/0141786 A1 | 6/2006 | Boezen et al. |
| 2006/0207328 A1 | 9/2006 | Zarabadi et al. |
| 2006/0213265 A1* | 9/2006 | Weber .............. G01C 19/5719 73/504.02 |
| 2006/0213266 A1 | 9/2006 | French et al. |
| 2006/0213268 A1 | 9/2006 | Asami et al. |
| 2006/0246631 A1 | 11/2006 | Lutz et al. |
| 2006/0283245 A1 | 12/2006 | Konno et al. |
| 2007/0013052 A1 | 1/2007 | Zhe et al. |
| 2007/0034005 A1 | 2/2007 | Acar et al. |
| 2007/0040231 A1 | 2/2007 | Harney et al. |
| 2007/0042606 A1 | 2/2007 | Wang et al. |
| 2007/0047744 A1 | 3/2007 | Harney et al. |
| 2007/0071268 A1 | 3/2007 | Harney et al. |
| 2007/0085544 A1 | 4/2007 | Viswanathan |
| 2007/0099327 A1 | 5/2007 | Hartzell et al. |
| 2007/0113653 A1 | 5/2007 | Nasiri et al. |
| 2007/0114643 A1 | 5/2007 | DCamp et al. |
| 2007/0165888 A1 | 7/2007 | Weigold |
| 2007/0180908 A1* | 8/2007 | Seeger .............. G01C 19/5719 73/504.12 |
| 2007/0205492 A1 | 9/2007 | Wang |
| 2007/0214883 A1 | 9/2007 | Durante et al. |
| 2007/0214891 A1 | 9/2007 | Robert et al. |
| 2007/0220973 A1 | 9/2007 | Acar |
| 2007/0222021 A1 | 9/2007 | Yao |
| 2007/0284682 A1 | 12/2007 | Laming et al. |
| 2008/0022762 A1 | 1/2008 | Skurnik |
| 2008/0049230 A1 | 2/2008 | Chin et al. |
| 2008/0079120 A1 | 4/2008 | Foster et al. |
| 2008/0079444 A1 | 4/2008 | Denison |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1 | 4/2008 | Acar |
| 2008/0122439 A1 | 5/2008 | Burdick et al. |
| 2008/0157238 A1 | 7/2008 | Hsiao |
| 2008/0157301 A1 | 7/2008 | Ramakrishna et al. |
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |
| 2008/0253057 A1 | 10/2008 | Rijks et al. |
| 2008/0284365 A1 | 11/2008 | Sri-Jayantha et al. |
| 2008/0290756 A1 | 11/2008 | Huang |
| 2008/0302559 A1 | 12/2008 | Leedy |
| 2008/0314147 A1 | 12/2008 | Nasiri |
| 2009/0007661 A1 | 1/2009 | Nasiri et al. |
| 2009/0056443 A1 | 3/2009 | Netzer |
| 2009/0064780 A1 | 3/2009 | Coronato et al. |
| 2009/0064781 A1 | 3/2009 | Ayazi et al. |
| 2009/0072663 A1 | 3/2009 | Ayazi et al. |
| 2009/0085191 A1 | 4/2009 | Najafi et al. |
| 2009/0114016 A1 | 5/2009 | Nasiri et al. |
| 2009/0140606 A1 | 6/2009 | Huang |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0217757 A1 | 9/2009 | Nozawa |
| 2009/0263937 A1 | 10/2009 | Ramakrishna et al. |
| 2009/0266163 A1 | 10/2009 | Ohuchi et al. |
| 2009/0272189 A1 | 11/2009 | Acar et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee |
| 2010/0058864 A1 | 3/2010 | Hsu et al. |
| 2010/0072626 A1 | 3/2010 | Theuss et al. |
| 2010/0077858 A1 | 4/2010 | Kawakubo et al. |
| 2010/0089154 A1 | 4/2010 | Ballas et al. |
| 2010/0122579 A1 | 5/2010 | Hsu et al. |
| 2010/0126269 A1 | 5/2010 | Coronato et al. |
| 2010/0132461 A1* | 6/2010 | Hauer .............. G01C 19/5747 73/504.12 |
| 2010/0155863 A1 | 6/2010 | Weekamp |
| 2010/0194615 A1 | 8/2010 | Lu |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0231452 A1* | 9/2010 | Babakhani .............. G01S 7/032 342/368 |
| 2010/0236327 A1 | 9/2010 | Mao et al. |
| 2010/0263445 A1 | 10/2010 | Hayner et al. |
| 2010/0294039 A1 | 11/2010 | Geen |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0074389 A1 | 3/2011 | Knierim et al. |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1 | 6/2011 | Tanaka et al. |
| 2011/0179868 A1 | 7/2011 | Kaino et al. |
| 2011/0192226 A1 | 8/2011 | Hayner et al. |
| 2011/0201197 A1 | 8/2011 | Nilsson et al. |
| 2011/0234312 A1 | 9/2011 | Lachhwani et al. |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0126349 A1 | 5/2012 | Horning et al. |
| 2012/0162947 A1 | 6/2012 | O'donnell et al. |
| 2012/0326248 A1 | 12/2012 | Daneman et al. |
| 2013/0051586 A1 | 2/2013 | Stephanou et al. |
| 2013/0098153 A1 | 4/2013 | Trusov et al. |
| 2013/0099836 A1 | 4/2013 | Shaeffer et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |
| 2013/0199263 A1 | 8/2013 | Egretzberger et al. |
| 2013/0199294 A1* | 8/2013 | Townsend .......... G01C 19/5677 73/504.13 |
| 2013/0221457 A1 | 8/2013 | Conti et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1* | 10/2013 | Opris .............. G01C 19/5726 702/104 |
| 2013/0268228 A1* | 10/2013 | Opris .............. G01C 25/00 702/104 |
| 2013/0270657 A1 | 10/2013 | Acar et al. |
| 2013/0270660 A1 | 10/2013 | Bryzek et al. |
| 2013/0271228 A1 | 10/2013 | Tao et al. |
| 2013/0277772 A1 | 10/2013 | Bryzek et al. |
| 2013/0277773 A1 | 10/2013 | Bryzek et al. |
| 2013/0283911 A1 | 10/2013 | Ayazi et al. |
| 2013/0298671 A1 | 11/2013 | Acar et al. |
| 2013/0328139 A1 | 12/2013 | Acar |
| 2013/0341737 A1 | 12/2013 | Bryzek et al. |
| 2014/0070339 A1 | 3/2014 | Marx |
| 2014/0190258 A1* | 7/2014 | Donadel .............. G01C 19/5776 73/504.12 |
| 2014/0275857 A1 | 9/2014 | Toth et al. |

(56) References Cited

U.S. PATENT DOCUMENTS

| | | | |
|---|---|---|---|
| 2014/0306773 A1* | 10/2014 | Kim | G01C 19/5776 331/135 |
| 2015/0059473 A1 | 3/2015 | Jia | |
| 2015/0114112 A1 | 4/2015 | Valzasina et al. | |
| 2015/0185012 A1 | 7/2015 | Acar | |
| 2016/0003618 A1* | 1/2016 | Boser | G01D 5/243 73/504.12 |
| 2016/0161256 A1 | 6/2016 | Lee et al. | |

FOREIGN PATENT DOCUMENTS

| | | |
|---|---|---|
| CN | 1206110 A | 1/1999 |
| CN | 1221210 A | 6/1999 |
| CN | 1272622 A | 11/2000 |
| CN | 102156201 A | 8/2001 |
| CN | 1389704 A | 1/2003 |
| CN | 1532524 A | 9/2004 |
| CN | 1595062 A | 3/2005 |
| CN | 1595063 A | 3/2005 |
| CN | 1603842 A | 4/2005 |
| CN | 1617334 A | 5/2005 |
| CN | 1659810 A | 8/2005 |
| CN | 1693181 A | 11/2005 |
| CN | 1780732 A | 5/2006 |
| CN | 1813192 A | 8/2006 |
| CN | 1816747 A | 8/2006 |
| CN | 1818552 A | 8/2006 |
| CN | 1886669 A | 12/2006 |
| CN | 1905167 A | 1/2007 |
| CN | 1948906 A | 4/2007 |
| CN | 101038299 A | 9/2007 |
| CN | 101044684 A | 9/2007 |
| CN | 101059530 A | 10/2007 |
| CN | 101067555 A | 11/2007 |
| CN | 101069099 A | 11/2007 |
| CN | 101078736 A | 11/2007 |
| CN | 101171665 A | 4/2008 |
| CN | 101180516 A | 5/2008 |
| CN | 101198874 A | 6/2008 |
| CN | 101213461 A | 7/2008 |
| CN | 101217263 A | 7/2008 |
| CN | 101239697 A | 8/2008 |
| CN | 101257000 A | 9/2008 |
| CN | 101270988 A | 9/2008 |
| CN | 101316462 A | 12/2008 |
| CN | 101329446 A | 12/2008 |
| CN | 101426718 A | 5/2009 |
| CN | 101459866 A | 6/2009 |
| CN | 101519183 A | 9/2009 |
| CN | 101520327 A | 9/2009 |
| CN | 101561275 A | 10/2009 |
| CN | 101634662 A | 1/2010 |
| CN | 101638211 A | 2/2010 |
| CN | 101639487 A | 2/2010 |
| CN | 101666813 A | 3/2010 |
| CN | 101738496 A | 6/2010 |
| CN | 101813480 A | 8/2010 |
| CN | 101839718 A | 9/2010 |
| CN | 101055180 A | 10/2010 |
| CN | 101855516 A | 10/2010 |
| CN | 101858928 A | 10/2010 |
| CN | 101916754 A | 12/2010 |
| CN | 101922934 A | 12/2010 |
| CN | 201688848 U | 12/2010 |
| CN | 102109345 A | 6/2011 |
| CN | 102332894 A | 1/2012 |
| CN | 102337541 A | 2/2012 |
| CN | 102364671 A | 2/2012 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 203261317 U | 10/2013 |
| CN | 103403495 A | 11/2013 |
| CN | 200301454 U | 11/2013 |
| CN | 203275441 U | 11/2013 |
| CN | 203275442 U | 11/2013 |
| CN | 203349832 U | 12/2013 |
| CN | 203349834 U | 12/2013 |
| CN | 103663344 A | 3/2014 |
| CN | 203683082 U | 7/2014 |
| CN | 203719664 U | 7/2014 |
| CN | 104094084 A | 10/2014 |
| CN | 104105945 A | 10/2014 |
| CN | 104220840 A | 12/2014 |
| CN | 104272062 A | 1/2015 |
| CN | 103221778 B | 3/2016 |
| CN | 104272062 B | 5/2016 |
| DE | 112011103124 T5 | 12/2013 |
| DE | 102013014881 A1 | 3/2014 |
| EP | 0638782 A1 | 2/1995 |
| EP | 1055910 A1 | 11/2000 |
| EP | 1335185 A1 | 8/2003 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2096759 A1 | 9/2009 |
| EP | 2259019 A1 | 12/2010 |
| EP | 2466257 A1 | 6/2012 |
| JP | 0989927 A | 4/1997 |
| JP | 09089927 A | 4/1997 |
| JP | 10239347 A | 9/1998 |
| JP | 1164002 A | 3/1999 |
| JP | 2000046560 A | 2/2000 |
| JP | 2005024310 A | 1/2005 |
| JP | 2005114394 A | 4/2005 |
| JP | 2005294462 A | 10/2005 |
| JP | 3882972 B2 | 2/2007 |
| JP | 2007024864 A | 2/2007 |
| JP | 2008294455 A | 12/2008 |
| JP | 2009075097 A | 4/2009 |
| JP | 2009186213 A | 8/2009 |
| JP | 2009192458 A | 8/2009 |
| JP | 2009260348 A | 11/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |

(56) References Cited

FOREIGN PATENT DOCUMENTS

| | | |
|---|---|---|
| KR | 1020130116212 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-9311415 A1 | 6/1993 |
| WO | WO-9503534 A1 | 2/1995 |
| WO | WO-0107875 A1 | 2/2001 |
| WO | WO-0175455 A2 | 10/2001 |
| WO | WO-2008014246 A1 | 1/2008 |
| WO | WO-2008059757 A1 | 5/2008 |
| WO | WO-2008087578 A2 | 7/2008 |
| WO | WO-2009038924 A2 | 3/2009 |
| WO | WO-2009050578 A2 | 4/2009 |
| WO | WO-2009156485 A1 | 12/2009 |
| WO | WO-2011016859 A2 | 2/2011 |
| WO | WO-2011016859 A3 | 2/2011 |
| WO | WO-2011107542 A2 | 9/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

Definition of baseband signal downloaded from "Tech Terms" website Jul. 15, 2016.*
"Chinese Application Serial No. 201180055630.3, Office Action mailed Jul. 10, 2015", w/ English Claims, 8 pgs.
"Chinese Application Serial No. 201180055630.3, Response filed Sep. 25, 2015 to Office Action mailed Jul. 10, 2015", w/ English Claims, 14 pgs.
"Chinese Application Serial No. 201180055792.7, Office Action mailed Jul. 21, 2015", w/ English Translation, 5 pgs.
"Chinese Application Serial No. 201180055823.9, Office Action mailed Nov. 17, 2015", w/ English Translation, 8 pgs.
"Chinese Application Serial No. 201180055823.9,Response filed Aug. 3, 2015 to Office Action mailed Mar. 19, 2015", w/ English Translation, 14 pgs.
"Chinese Application Serial No. 201180055845.5, Office Action mailed Aug. 5, 2015", w/ English Translation, 5 pgs.
"Chinese Application Serial No. 201180055845.5, Response filed Nov. 20, 2015 to Office Action mailed Aug. 5, 2015", With English Claims, 9 pgs.
"Chinese Application Serial No. 201180055845.5,Response filed Jul. 13, 2015 to Office Action mailed Mar. 4, 2015", w/ English Translation, 17 pgs.
"Chinese Application Serial No. 201310115550.3, Response filed Sep. 30, 2015 to Office Action mailed May 22, 2015", w/ English Claims, 15 pgs.
"Chinese Application Serial No. 201310119730.9, Office Action mailed Jan. 29, 2016", w/ English Translation, 7 pgs.
"Chinese Application Serial No. 201310119806.8, Office Action mailed Jul. 3, 2015", w/ English Claims, 12 pgs.
"Chinese Application Serial No. 201310119806.8, Response filed Jan. 18, 2016 to Office Action mailed Jul. 3, 2015", (English Translation of Claims), 11 pgs.

"Chinese Application Serial No. 201310119986.X, Office Action mailed Dec. 18, 2015", w/ English Translation, 6 pgs.
"Chinese Application Serial No. 201310119986.X, Response filed Sep. 25, 2015 to Office Action mailed May 12, 2015", w/ English Claims, 7 pgs.
"Chinese Application Serial No. 201310120172.8, Office Action mailed Nov. 3, 2015", w/ English Translation, 11 pgs.
"Chinese Application Serial No. 201310127961.4, Response filed Sep. 2, 2015 to Office Action mailed May 6, 2015", w/ English Claims, 19 pgs.
"Chinese Application Serial No. 201310128046.7, Office Action mailed Jul. 23, 2015", w/ English Translation, 7 pgs.
"Chinese Application Serial No. 201310128046.7, Response filed Oct. 14, 2015 to Office Action mailed Jul. 23, 2015", w/ English Claims, 23 pgs.
"Chinese Application Serial No. 201310415336.X, Office Action mailed Jul. 3, 2015", w/ English Claims, 9 pgs.
"Chinese Application Serial No. 201310415336.X, Response filed Jan. 18, 2016 to Office Action mailed Jul. 3, 2015", (English Translation of Claims), 11 pgs.
"Chinese Application Serial No. 201380007523.2, Office Action mailed Dec. 31, 2015", w/ English Translation, 12 pgs.
"Chinese Application Serial No. 201380007577.9, Office Action mailed Dec. 21, 2015", w/ English Translation, 9 pgs.
"Chinese Application Serial No. 201380007588.7, Response filed Oct. 26, 2015 to Office Action mailed Jun. 10, 2015", w/ English Claims, 9 pgs.
"Chinese Application Serial No. 201380007615.0, Response filed Jan. 5, 2016 to Office Action mailed May 6, 2015", w/ English Claims, 13 pgs.
"Chinese Application Serial No. 201380007615.0, Response filed Nov. 23, 2015 to Office Action mailed May 6, 2015", With English Claims, 15 pgs.
"European Application Serial No. 11826069.4, Extended European Search Report mailed Jul. 23, 2015", 8 pgs.
"European Application Serial No. 11827347.3, Extended European Search Report mailed Jul. 31, 2015", 6 pgs.
"European Application Serial No. 11827357.2, Extended European Search Report mailed Aug. 26, 2015", 4 pgs.
"European Application Serial No. 13001694.2, Extended European Search Report mailed Oct. 2, 2015", 8 pgs.
"European Application Serial No. 13001695.9, Response filed Aug. 24, 2015 to Extended European Search Report mailed Jan. 22, 2015", 9 pgs.
"European Application Serial No. 13001720.5, Extended European Search Report mailed Aug. 20, 2015", 7 pgs.
"European Application Serial No. 13001918.5, Extended European Search Report mailed Dec. 3, 2015", 8 pgs.
"Chinese Application Serial No. 201180044919.5, Office Action mailed Jun. 25, 2015", w/ English Translation, 8 pgs.
"Chinese Application Serial No. 201180054796.3, Office Action mailed Jun. 4, 2015", w/ English Translation, 7 pgs.
"Chinese Application Serial No. 201310115550.3, Office Action mailed May 22, 2015", w/ English Claims, 8 pgs.
"Chinese Application Serial No. 201310119986.X, Office Action mailed May 12, 2015", w/ English Claims, 14 pgs.
"Chinese Application Serial No. 201380007588.7, Office Action mailed Jun. 10, 2015", w/ English Claims, 7 pgs.
"Chinese Application Serial No. 201380007615.0, Office Action mailed May 6, 2015", w/ English Claims, 7 pgs.
"Chinese Application Serial No. 201180054796.3, Office Action mailed Sep. 4, 2014", w/English Claims, 11 pgs.
"Chinese Application Serial No. 201180055029.4, Response filed Nov. 14, 2014 to Office Action mailed Jul. 2, 2014", w/English Claims, 23 pgs.
"Chinese Application Serial No. 201310118845.6, Office Action mailed Sep. 9, 2014", 8 pgs.
"Chinese Application Serial No. 201310119472.4, Office Action mailed Sep. 9, 2014", w/English Translation, 11 pgs.
"European Application Serial No. 11826043.9, Office Action mailed May 6, 2013", 2 pgs.
"European Application Serial No. 11826043.9, Response filed Nov. 4, 2013 to Office Action mailed May 6, 2013", 6 pgs.

(56) References Cited

OTHER PUBLICATIONS

"European Application Serial No. 11826067.8, Extended European Search Report mailed Oct. 6, 2014", 10 pgs.
"European Application Serial No. 11826070.2, Response filed Sep. 19, 2014 to Office Action mailed Mar. 12, 2014", 11 pgs.
"European Application Serial No. 11826071.0, Response filed Sep. 19, 2014 to Office Action mailed Mar. 12, 2014", 20 pgs.
"European Application Serial No. 11827347.3, Office Action mailed May 2, 2013", 6 pgs.
"European Application Serial No. 11827347.3, Response filed Oct. 30, 2013 to Office Action mailed May 2, 2013", 9 pgs.
"European Application Serial No. 11827384.6, Extended European Search Report mailed Nov. 12, 2014", 6 pgs.
"European Application Serial No. 13001695.9, European Search Report mailed Oct. 5, 2014", 6 pgs.
Dunn, C, et al., "Efficient linearisation of sigma-delta modulators using single-bit dither", Electronics Letters 31(12), (Jun. 1995), 941-942.
Kulah, Haluk, et al., "Noise Analysis and Characterization of a Sigma-Delta Capacitive Silicon Microaccelerometer", 12th International Conference on Solid State Sensors, Actuators and Microsystems, (2003), 95-98.
Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
"Chinese Application Serial No. 201180053926.1, Office Action mailed Jan. 13, 2014", 7 pgs.
"Chinese Application Serial No. 201180054796.3, Office Action mailed Jan. 16, 2014", 8 pgs.
"Chinese Application Serial No. 201180055029.4, Office Action mailed Jan. 13, 2014", 7 pgs.
"Chinese Application Serial No. 201320172366.8, Office Action mailed Jan. 30, 2014", 3 pgs.
"Chinese Application Serial No. 201320172366.8, Office Action mailed Oct. 25, 2013", 8 pgs.
"Chinese Application Serial No. 201320172366.8, Response filed Dec. 24, 2013 to Office Action mailed Oct. 25, 2013", 11 pgs.
"Chinese Application Serial No. 201320565239.4, Office Action mailed Jan. 16, 2014", w/English Translation, 3 pgs.
"European Application Serial No. 10806751.3, Extended European Search Report mailed Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action mailed Dec. 27, 2013", 8 pgs.
"Korean Application Serial No. 10-2013-7009775, Response filed Oct. 29, 2013 to Office Action mailed Sep. 17, 2013", w/English Claims, 23 pgs.
"Korean Application Serial No. 10-2013-7009777, Office Action mailed Jan. 27, 2014", 5 pgs.
"Korean Application Serial No. 10-2013-7009777, Response filed Nov. 5, 2013 to Office Action mailed Sep. 17, 2013", 11 pgs.
"Korean Application Serial No. 10-2013-7009788, Office Action mailed Dec. 27, 2013", w/English Translation, 10 pgs.
"Korean Application Serial No. 10-2013-7009788, Response filed Oct. 29, 2013 to Office Action mailed Aug. 29, 2013", w/English Claims, 22 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.

(56) References Cited

OTHER PUBLICATIONS

Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?...>, (Jan. 1, 2004), 123 pgs.
"Chinese Application Serial No. 2010800423190, Office Action mailed Mar. 26, 2014", 10 pgs.
"Chinese Application Serial No. 201180053926.1, Response filed Apr. 29, 2014 to Office Action mailed Jan. 13, 2014", w/English Claims, 10 pgs.
"Chinese Application Serial No. 201180055029.4, Response filed May 27, 2014 to Office Action mailed Jan. 13, 2014", w/English Claims, 29 pgs.
"Chinese Application Serial No. 201180055309.5, Office Action mailed Mar. 31, 2014", w/English Claims, 7 pgs.
"Chinese Application Serial No. 201320172366.8, Response filed Mar. 18, 2014 to Office Action mailed Jan. 30, 2014", w/English Claims, 20 pgs.
"Chinese Application Serial No. 201320565239.4, Response filed Mar. 31, 2014 to Office Action mailed Jan. 16, 2014", w/English Claims, 38 pgs.
"European Application Serial No. 118260070.2, Office Action mailed Mar. 12, 2014", 1 pg.
"European Application Serial No. 11826070.2, Extended European Search Report mailed Feb. 21, 2014", 5 pgs.
"European Application Serial No. 11826071.0, Extended European Search Report mailed Feb. 20, 2014", 6 pgs.
"European Application Serial No. 11826071.0, Office Action mailed Mar. 12, 2014", 1 pg.
"European Application Serial No. 13001692.6, Response filed Apr. 1, 2014 to Extended European Search Report mailed Jul. 24, 2013", 19 pgs.
"European Application Serial No. 13001721.3, Response filed Apr. 7, 2014 to Extended European Search Report mailed Jul. 18, 2013", 25 pgs.
"Korean Application Serial No. 10-2013-7009777, Response filed Apr. 28, 2014", w/English Claims, 19 pgs.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 2011", 3 pgs.
"International Application Serial No. PCT/US2010/002166, Written Opinion mailed Feb. 28, 2011", 4 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052006, International Preliminary Report on Patentability mailed Mar. 28, 2013", 7 pgs.
"International Application Serial No. PCT/US2011/052006, Search Report mailed Apr. 16, 2012", 3 pgs.
"International Application Serial No. PCT/US2011/052006, Written Opinion mailed Apr. 16, 2012", 5 pgs.
"International Application Serial No. PCT/US2011/052059, International Preliminary Report on Patentability mailed Jan. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 20, 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.
"International Application Serial No. PCT/US2011/052064, International Preliminary Report on Patentability mailed Mar. 28, 2013", 5 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052065, International Preliminary Report on Patentability mailed Mar. 28, 2013", 7 pgs.
"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", 1 pg.
"International Application Serial No. PCT/US2011/051994, International Preliminary Report on Patentability mailed Mar. 28, 2013", 8 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2011/052369, International Preliminary Report on Patentability mailed Apr. 4, 2013", 5 pgs.

(56) References Cited

OTHER PUBLICATIONS

"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May, 14, 2013", 3 pgs.
"International Application Serial No. PCT/US2013/023877, Written Opinion mailed May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
"Chinese Application Serial No. 201180054796.3, Office Action mailed Jan. 30, 2015", with English translation of claims, 5 pgs.
"Chinese Application Serial No. 201180054796.3, Response filed Nov. 19, 2014 to Office Action mailed Sep. 4, 2014", with English translation of claims, 7 pgs.
"Chinese Application Serial No. 201180054796.3, Response filed Apr. 14, 2015 to Office Action mailed Jan. 30, 2015", w/ English Claims, 30 pgs.
"Chinese Application Serial No. 201180055309.5, Office Action mailed Jan. 8, 2015", with English translation of claims, 5 pgs.
"Chinese Application Serial No. 201180055630.3, Office Action mailed Dec. 22, 2014", with English translation of claims, 10 pgs.
"Chinese Application Serial No. 201180055630.3, Response filed Apr. 20, 2015 to Office Action mailed Dec. 22, 2014", w/ English Claims, 10 pgs.
"Chinese Application Serial No. 201180055792.7, Office Action mailed Dec. 22, 2014", with English translation of claims, 10 pgs.
"Chinese Application Serial No. 201180055792.7, Response filed May 5, 2015 to Office Action mailed Dec. 22, 2014", w/ English Claims, 15 pgs.
"Chinese Application Serial No. 201180055794.6, Office Action mailed Dec. 17, 2014", with English translation of claims, 9 pgs.
"Chinese Application Serial No. 201180055794.6, Response filed May 4, 2015 to Office Action mailed Dec. 17, 2014", w/ English Claims, 15 pgs.
"Chinese Application Serial No. 201180055823.9, Office Action mailed Mar. 19, 2015", w/ English Claims, 8 pgs.
"Chinese Application Serial No. 201180055845.5, Office Action mailed Mar. 4, 2015", w/ English Claims, 8 pgs.
"Chinese Application Serial No. 2013101188456, Response filed Jan. 21, 2015", with English translation of claims, 16 pgs.
"Chinese Application Serial No. 201310119472.4, Response filed Jan. 21, 2015", with English translation of claims, 16 pgs.
"Chinese Application Serial No. 201310119730.9, Office Action mailed May 4, 2015", w/ English Claims, 8 pgs.
"Chinese Application Serial No. 201310127961.4, Office Action mailed May 6, 2015", w/ English Claims, 7 pgs.
"Chinese Application Serial No. 201380007588.7, Response filed Oct. 24, 2014", with English translation, 3 pgs.
"Chinese Application Serial No. 201380007615.0, Response filed Oct. 24, 2014", with English translation, 3 pgs.
"European Application Serial No. 11826067.8, Response filed Apr. 27, 2015 to Extended European Search Report mailed Oct. 6, 2014", 32 pgs.
"European Application Serial No. 11826068.6, Response filed Feb. 9, 2015", 30 pgs.
"European Application Serial No. 11826071.0, Examination Notification Art. 94(3) mailed Dec. 11, 2014", 4 pgs.
"European Application Serial No. 11826071.0, Response filed Apr. 13, 2015 to Examination Notification Art. 94(3) mailed Dec. 11, 2014", 5 pgs.
"European Application Serial No. 13001695.9, Extended European Search Report mailed Jan. 22, 2015", 8 pgs.
"European Application Serial No. 13001719.7, Response filed Jan. 21, 2015", 29 pgs.
"Chinese Application Serial No. 2010800423190, Response filed Aug. 11, 2014 to Office Action mailed Mar. 26, 2014", w/English Claims, 11 pgs.
"Chinese Application Serial No. 201180054796.3, Response filed Jun. 30, 2014 to Office Action mailed Jan. 16, 2014", w/English Claims, 3 pgs.
"Chinese Application Serial No. 201180055029.4, Office Action mailed Jul. 2, 2014", w/English Translation, 5 pgs.
"Chinese Application Serial No. 201180055309.5, Response filed Aug. 13, 2014 to Office Action mailed Mar. 31, 2014", w/English Claims, 27 pgs.
"Chinese Application Serial No. 201380007588.7, Notification to Make Rectification mailed Aug. 18, 2014", 2 pgs.
"Chinese Application Serial No. 201380007615.0, Notification to Make Rectification mailed Aug. 18, 2014", 2 pgs.
"European Application Serial No. 10806751.3, Response filed Jul. 24, 2014 to Office Action mailed Jan. 24, 2014", 26 pgs.
"European Application Serial No. 11826068.6, Extended European Search Report mailed Jul. 16, 2014", 10 pgs.
"European Application Serial No. 13001719.7, Extended European Search Report mailed Jun. 24, 2014", 10 pgs.
"International Application Serial No. PCT/US2013/021411, International Preliminary Report on Patentability mailed Aug. 14, 2014", 7 pgs.
"International Application Serial No. PCT/US2013/023877, International Preliminary Report on Patentability mailed Aug. 14, 2014", 7 pgs.
"International Application Serial No. PCT/US2013/024138, International Preliminary Report on Patentability mailed Aug. 14, 2014", 6 pgs.
"International Application Serial No. PCT/US2013/024149, International Preliminary Report on Patentability mailed Aug. 14, 2014", 6 pgs.
Sebastiano, Fabio, et al., "A 1.2-V 10-µW NPN-Based Temperature Sensor in 65-nm CMOS With an Inaccuracy of 0.2 C (3) From -70 C to 125 C", IEEE Journal of Solid-State Circuits, vol. 45, No. 12, Dec. 2010, (Dec. 1, 2010), 2591-2601.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.
"U.S. Appl. No. 14/658,579, Non Final Office Action mailed Mar. 16, 2016", 5 pgs.
"U.S. Appl. No. 15/005,783 Preliminary Amendment Filed May, 26, 2016", 9 pgs.
"Chinese Application Serial No. 201180044919.5, Office Action mailed Apr. 25, 2016", w/ English Translation, 7 pgs.
"Chinese Application Serial No. 201180044919.5, Response filed May 12, 2016 to Office Action mailed Apr. 25, 2016", w/ English Translation, 13 pgs.

(56) References Cited

OTHER PUBLICATIONS

"Chinese Application Serial No. 2011800556303, Office Action mailed May 16, 2016", (English Translation), 9 pgs.

"Chinese Application Serial No. 201180055630.3, Office Action mailed Dec. 7, 2015", W/ English Translation, 5 pgs.

"Chinese Application Serial No. 201180055630.3, Response filed Feb. 19, 2016 to Office Action mailed Dec. 7, 2015", W/ English Translation of Claim, 10 pgs.

"Chinese Application Serial No. 201180055823.9, Response filed Feb. 2, 2016 to Office Action mailed Nov. 17, 2015", (English Translation of Claims), 15 pgs.

"Chinese Application Serial No. 201310119730.9, Response filed Jun. 13, 2016 to Office Action mailed Jan. 29, 2016", 19 pgs.

"Chinese Application Serial No. 201310119806.8, Office Action mailed May 13, 2016", w/ English Translation, 8 pgs.

"Chinese Application Serial No. 201310119986.X, Response filed Apr. 29, 2016 to Office Action mailed Dec. 18, 2015", (English Translation of Claims), 14 pgs.

"Chinese Application Serial No. 201310120172.8, Response filed May 18, 2016 to Office Action mailed Nov. 3, 2015", with English translation of claims, 21 pgs.

"Chinese Application Serial No. 201310415336.X, Office Action mailed Apr. 26, 2016", w/ English Translation, 11 pgs.

"Chinese Application Serial No. 201380007523.2, Response filed May 31, 2016 to Office Action mailed Dec. 31, 2015", with English translation of claims, 16 pgs.

"Chinese Application Serial No. 201380007577.9, Response filed May 5, 2016 to Office Action mailed Dec. 21, 2015", w/ English Claims, 17pgs.

"European Application Serial No. 11826043.9, Extended European Search Report mailed Feb. 23, 2016", 6 pgs.

"European Application Serial No. 11826069.4, Response filed Feb. 22, 2016 to Extended European Search Report mailed Jul. 23, 2015", W/ English Translation, 26 pgs.

"European Application Serial No. 13001917.7, Extended European Search Report mailed Apr. 11, 2016", 5 pgs.

"Korean Application Serial No. 2012-7005729, Office Action mailed May 3, 2016", w/ English Claims, 11 pgs.

* cited by examiner

MEMS QUADRATURE CANCELLATION AND SIGNAL DEMODULATION

CLAIM OF PRIORITY

This application claims the benefit of priority under 35 U.S.C. 119(e) to Tao et al., U.S. Provisional Patent Application Ser. No. 61/623,423, entitled, "METHOD OF QUADRATURE CANCELLATION AND SIGNAL DEMODULATION IN MEMS GYROSCOPE," filed Apr. 12, 2012, hereby incorporated by reference herein in its entirety.

BACKGROUND

Micro-electromechanical systems (MEMS) include small mechanical devices performing electrical and mechanical functions that are fabricated using photo-lithography techniques similar to techniques used to fabricate integrated circuits. Some MEMS devices are sensors that can detect motion such as an accelerometer or detect angular rate such as a gyroscope. A capacitive MEMS gyroscope undergoes a change in capacitance in response to a change in angular rate.

OVERVIEW

This document discusses, among other things, apparatus and methods quadrature cancelation of sense information from a micro-electromechanical system (MEMS) device, such as a MEMS gyroscope. In certain examples, a quadrature cancellation apparatus can include a drive charge amplifier configured to couple to a proof mass of a MEMS device and to provide oscillation motion information, a first sense charge amplifier configured to couple to the proof mass and to provide first sense information of a first movement of the MEMS device, a first programmable amplifier configured to receive the oscillation motion information and provide amplified oscillation motion information, a first summer configured to cancel quadrature error of the first sense information using the first sense information and the amplified oscillation motion information to provide quadrature-corrected first sense information, a phase shifter configured to receive the oscillation motion information and to provide carrier information, and a first multiplier configured to provide demodulated first sense information using the quadrature-corrected first sense information and the carrier information.

This overview is intended to provide a general overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
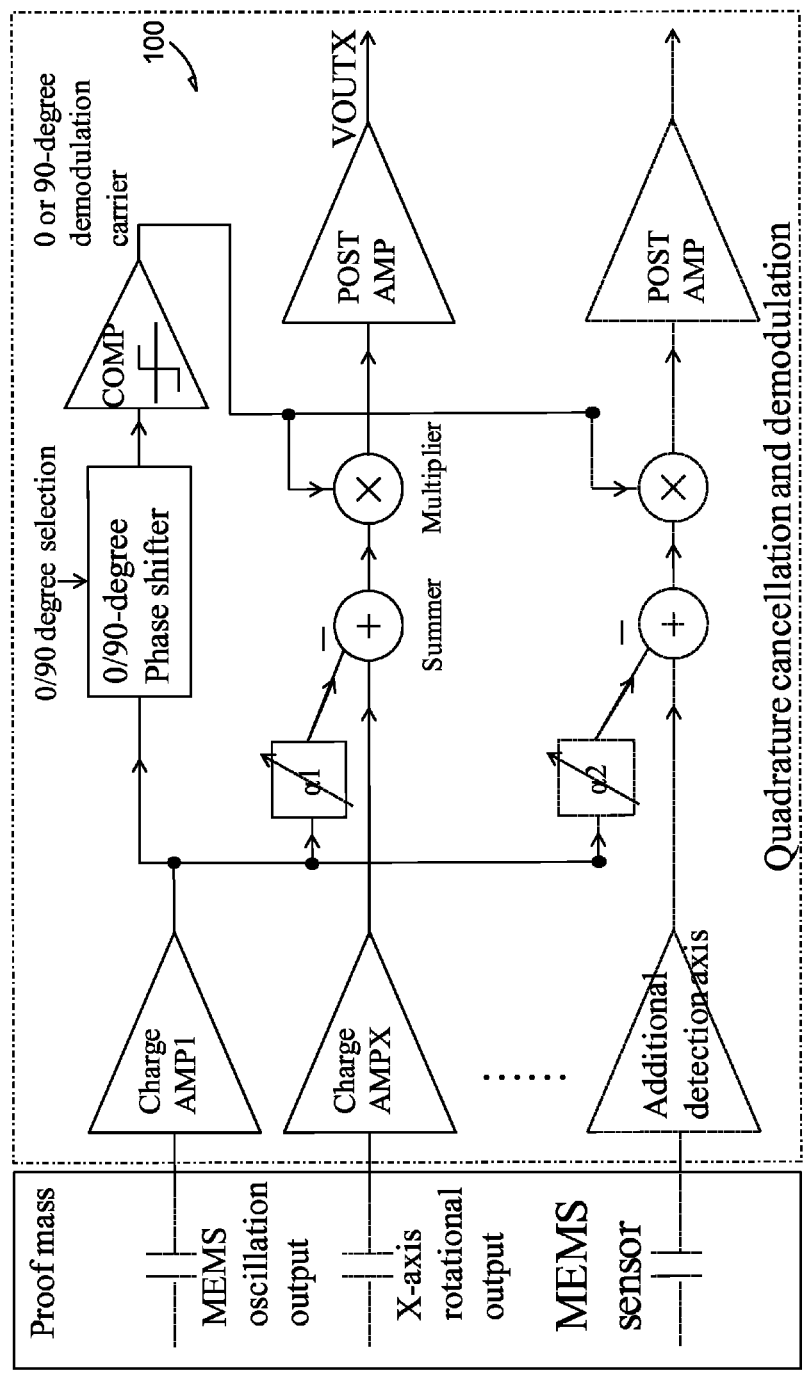
FIG. 1 illustrates generally an example MEMS device 100 configured to provide passive quadrature error cancellation and carrier demodulation.

The present inventors have recognized, among other things, apparatus and methods to cancel quadrature error in a detected microelectromechanical system (MEMS) gyroscope axis rotational signal (e.g., an x-axis rotational signal, etc.), to create a demodulation carrier from a detected MEMS oscillation signal, and to demodulate the MEMS gyroscope axis rotational signal. The apparatus and methods disclosed herein can increase MEMS gyroscope performance, decrease power consumption, and, in certain examples, decrease silicon area with respect to existing MEMS devices.

In an example, delay-matched charge amplifiers can be used for both a MEMS oscillation signal and a corresponding axis rotational signal, and the amplified MEMS oscillation signal can then be used to cancel quadrature error in the corresponding axis rotational signal. Because charge amplifiers generally track each other over process, voltage, or temperature (PVT) variations, the delay-matched charge amplifiers, in this example, can increase MEMS gyroscope performance over the range of operating conditions.

In an example, a programmable passive amplifier and summer for quadrature error cancellation can be integrated to provide passive quadrature error cancellation and carrier demodulation. In certain examples, the gain ($\alpha 1$) of the amplifier and the summer can be PVT compensated for higher performance. Moreover, passive components, in the amplifier, the summer, or otherwise, can minimize signal distortion and gain/phase variation with respect to PVT changes. In certain examples, the amplifier and the summer can be merged into a simple switch matrix, reducing the overall silicon area of the device.

In an example, the passive multiplier can perform demodulation before the post-amplifier portion of the device, including, for example, the baseband buffer. Cancellation of quadrature error before entering the post-amplifier portion of the device can reduce the dynamic range requirements and, in turn, the power consumption of the baseband amplifier or one or more other post-amplifier components. Further, cancellation of quadrature error before entering the post-amplifier portion of the device can reduce phase shifter accuracy requirement of the device.

Further, in certain examples, the apparatus and methods disclosed herein can include a selectable 0/90-degree phase shifter that can greatly simplify production test of the device. In an example, the phase shifter can be set to 0-degrees during test and the gain ($\alpha 1$) of the amplifier can be adjusted until the root mean squared (RMS) value of the baseband amplifier is minimized, ensuring accurate quadrature cancellation when the phase shifter is set back at 90-degrees.

The apparatus and methods disclosed herein can, among other things, increase MEMS gyroscope performance in zero-rate drive, increase MEMS gyroscope sensitivity linearity (e.g., using passive quadrature error cancellation and rate signal demodulation), reduce linearity and power consumption requirements of the baseband amplifier (e.g., by cancelling quadrature error before demodulation/baseband amplification), and reduce the phase-shift accuracy requirement on the 0/90-degree phase shifter, simplifying production of the device.

FIG. 1 illustrates generally an example MEMS device 100 configured to provide passive quadrature error cancellation and carrier demodulation. For simplicity, operation is described with respect to the received x-axis rotational signal only. However, similar components and methods can be used with respect to the one or more other MEMS gyroscope axes.

In an example, the MEMS device 100 can include a first charge amplifier (AMP1) configured to amplify a received MEMS oscillation signal (the quadrature error signal). A second charge amplifier (AMPX) can be configured to amplify a received MEMS x-axis rotational signal, which can also include a potential quadrature error signal.

In an example, a programmable gain path ($\alpha 1$) and a summer can be used to cancel quadrature error in the x-axis rotational signal. In an example, similar components and methods can be used to cancel quadrature errors in one or more other axis.

In an example, a 0/90-degree phase shifter and a comparator can be used to create a demodulation signal for the x-axis rotational signal, and a multiplier can be used to demodulate the x-axis rotational signal.

Figure 2:
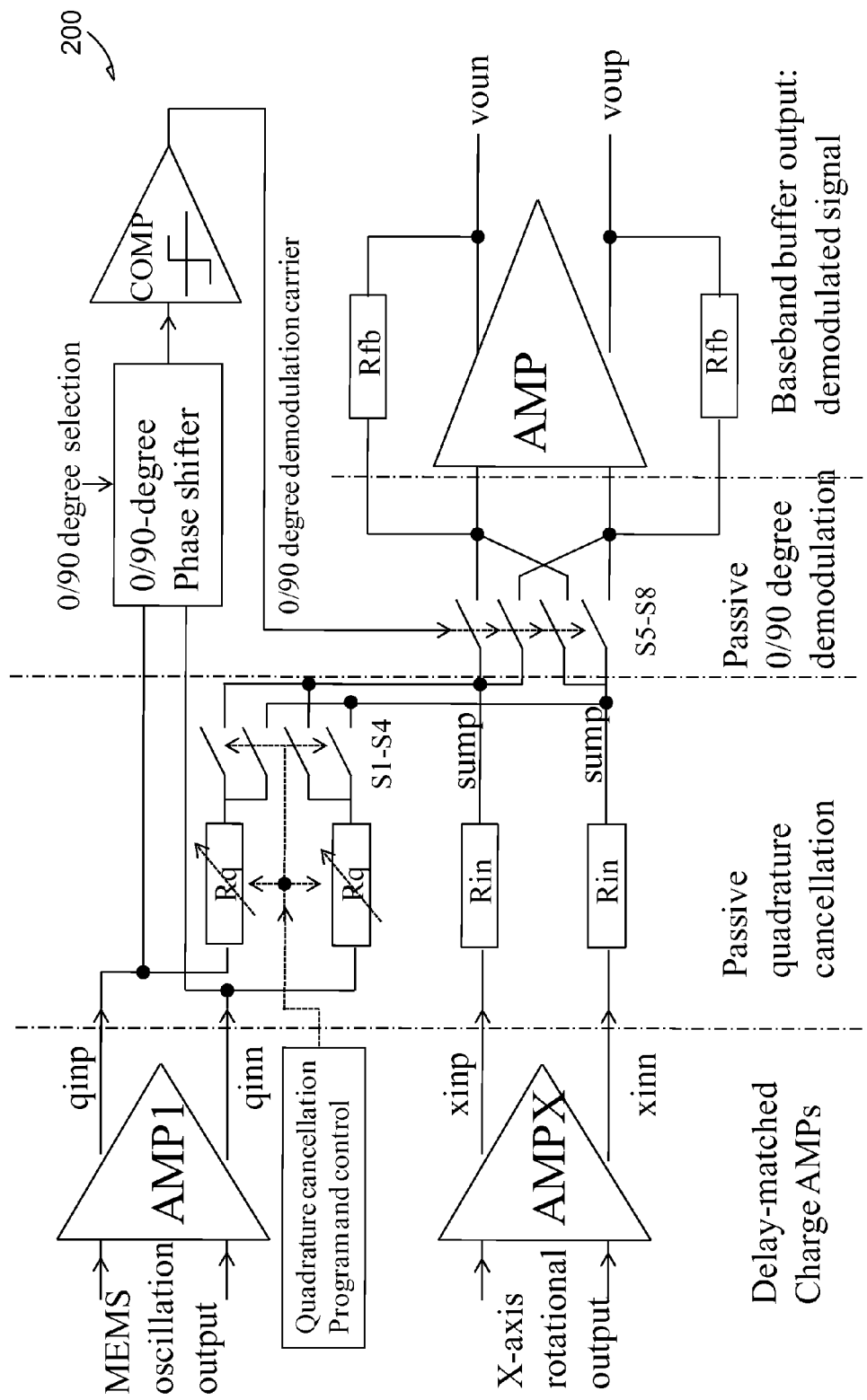
FIG. 2 illustrates generally an example MEMS device 200 configured to provide differential passive quadrature error cancellation and carrier demodulation.

FIG. 2 illustrates generally an example MEMS device 200 configured to provide differential passive quadrature error cancellation and carrier demodulation. For simplicity, operation is described with respect to the received x-axis rotational signal only. However, similar components and methods can be used with respect to the one or more other MEMS gyroscope axes.

In an example, resistors (Rq, Rin, Rfb) can define a gain path ($\alpha 1$) and the gain through a baseband amplifier (AMP). In certain examples, summation/quadrature cancellation can be realized at input nodes to the baseband amplifier (virtual ground), and multiplication can be realized using simple switches.

In other examples, one or more other components can be used to implement the gain path ($\alpha 1$), summation/quadrature cancellation, or multiplication, such as capacitor charge summation and switching, etc.

ADDITIONAL NOTES AND EXAMPLES

In Example 1, a quadrature cancellation apparatus can include a drive charge amplifier configured to couple to a proof mass of a MEMS device and to provide oscillation motion information, a first sense charge amplifier configured to couple to the proof mass and to provide first sense information of a first movement of the MEMS device, a first programmable amplifier configured to receive the oscillation motion information and provide amplified oscillation motion information, a first summer configured to cancel quadrature error of the first sense information using the first sense information and the amplified oscillation motion information to provide quadrature-corrected first sense information, a phase shifter configured to receive the oscillation motion information and to provide carrier information, and a first multiplier configured to provide demodulated first sense information using the quadrature-corrected first sense information and the carrier information.

In Example 2, the apparatus of Example 1 optionally includes a first baseband buffer configured to receive the demodulated first sense information and to provide buffered first sense information.

In Example 3, a first switch matrix of any one or more of Examples 1-2 optionally includes the first summer and the first multiplier.

In Example 4, the drive charge amplifier and the first sense charge amplifier of any one or more of Examples 1-3 optionally include delay-matched amplifiers.

In Example 5, the phase shifter of any one or more of Examples 1-4 optionally is programmable to provide about 90 degrees of phase shift in a first state and about zero degrees of phase shift in a second, calibration state.

In Example 6, the apparatus of any one or more of Examples 1-5 optionally includes a second sense charge amplifier configured to couple to the proof mass and to provide second sense information of a second movement of the MEMS device, a second programmable amplifier configured to receive the oscillation motion information and provide amplified oscillation motion information, a second summer configured to cancel quadrature error of the second sense information using the second sense information and the amplified oscillation motion information to provide quadrature-corrected second sense information, and a second multiplier configured to provide demodulated second sense information using the quadrature-corrected second sense information and the carrier information.

In Example 7, the apparatus of any one or more of Examples 1-6 optionally includes a second baseband buffer configured to receive the demodulated second sense information and to provide buffered second sense information.

In Example 8, a second switch matrix of any one or more of Examples 1-7 optionally includes the second summer and the second multiplier.

In Example 9, the drive charge amplifier and the second sense charge amplifier of any one or more of Examples 1-8 optionally include delay-matched amplifiers.

In Example 10, a method for canceling quadrature error of a MEMS device signal can include providing oscillation motion information using a drive charge amplifier coupled to a proof mass of a MEMS device, providing first sense information using a first sense charge amplifier coupled to the proof mass, the first sense information corresponding to a first movement of the MEMS device, providing amplified oscillation motion information using a first programmable amplifier and the oscillation motion information, canceling first quadrature error of the first sense information using a first summer and the amplified oscillation motion information to provide quadrature-corrected first sense information, shifting a phase of the oscillation motion information using a phase shifter to provide carrier information, and demodulating the quadrature-corrected first sense information using a first multiplier, the quadrature-corrected first sense information, and the carrier information to provide demodulated first sense information.

In Example 11, the method of any one or more of Examples 1-10 optionally includes buffering the demodulated first sense information using a first baseband buffer to provide buffered first sense information.

In Example 12, the canceling first quadrature error of the first sense information using a first summer and the demodulating the quadrature-corrected first sense information using a first multiplier of any one or more of Examples 1-11 optionally includes using a first switch matrix including the first summer and the first multiplier.

In Example 13, the providing oscillation motion information using a drive charge amplifier coupled to a proof mass of a MEMS device and the providing first sense information using a first sense charge amplifier coupled to the proof mass of any one or more of Examples 1-12 optionally includes using a drive charge amplifier and a first sense charge amplifier that are delay-matched to each other.

In Example 14, the shifting a phase of the oscillation motion information using a phase shifter to provide carrier information of any one or more of Examples 1-13 optionally includes shifting a phase of the oscillation motion information 90 degrees using a first state of the phase shifter to provide the carrier information.

In Example 15, the method of any one or more of Examples 1-14 optionally includes shifting a phase of the oscillation motion information zero degrees using a second state of the phase shifter to calibrate a gain of the first programmable amplifier.

In Example 16, a micro-electromechanical system (MEMS) system can include a MEMS gyroscope having a proof mass, and a quadrature cancellation circuit configured to provide movement information of the MEMS gyroscope. The quadrature cancellation can include a drive charge amplifier configured to couple to the proof mass and to provide oscillation motion information, a first sense charge amplifier configured to couple to the proof mass and to provide first sense information of a first movement of the MEMS device, a first programmable amplifier configured to receive the oscillation motion information and provide amplified oscillation motion information, a first summer configured to cancel quadrature error of the first sense information using the first sense information and the amplified oscillation motion information to provide quadrature-corrected first sense information, a phase shifter configured to receive the oscillation motion information and to provide carrier information, and a first multiplier configured to provide demodulated first sense information using the quadrature-corrected first sense information and the carrier information.

In Example 17, the system of any one or more of Examples 1-16 optionally includes a first baseband buffer configured to receive the demodulated first sense information and to provide buffered first sense information, wherein the movement information includes the buffered first sense information.

In Example 18, the quadrature cancellation circuit of any one or more of Examples 1-17 optionally includes a second sense charge amplifier configured to couple to the proof mass and to provide second sense information of a second movement of the MEMS device, a second programmable amplifier configured to receive the oscillation motion information and provide amplified oscillation motion information, a second summer configured to cancel quadrature error of the second sense information using the second sense information and the amplified oscillation motion information to provide quadrature-corrected second sense information, a second multiplier configured to provide demodulated second sense information using the quadrature-corrected second sense information and the carrier information, and a second baseband buffer configured to receive the demodulated second sense information and to provide buffered second sense information, wherein the movement information includes the buffered second sense information, and wherein the first movement and the second movement are not parallel to each other.

In Example 19, a first switch matrix of any one or more of Examples 1-18 optionally includes the first summer and the first multiplier.

In Example 20, the drive charge amplifier and the first sense charge amplifier of any one or more of Examples 1-19 optionally include delay-matched amplifiers.

Example 21 can include, or can optionally be combined with any portion or combination of any portions of any one or more of Examples 1 through 21 to include, subject matter that can include means for performing any one or more of the functions of Examples 1 through 21, or a machine-readable medium including instructions that, when performed by a machine, cause the machine to perform any one or more of the functions of Examples 1 through 21.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method for canceling quadrature error of a MEMS device signal, the method comprising:
   providing oscillation motion information using a drive charge amplifier coupled to a proof mass of a MEMS device;
   providing first sense information using a first sense charge amplifier coupled to the proof mass, the first sense information corresponding to a first movement of the MEMS device;
   providing amplified oscillation motion information using a first programmable amplifier and the oscillation motion information;
   canceling first quadrature error of the first sense information using a first summer and the amplified oscillation motion information to provide quadrature-corrected first sense information;
   shifting a phase of the oscillation motion information 90 degrees using a first state of a phase shifter to provide carrier information;
   shifting a phase of the oscillation motion information zero degrees using a second state of the phase shifter to calibrate a gain of the first programmable amplifier; and
   demodulating the quadrature-corrected first sense information using a first multiplier, the quadrature-corrected first sense information, and the carrier information to provide demodulated first sense information.

2. The method of claim 1, including buffering the demodulated first sense information using a first baseband buffer to provide buffered first sense information.

3. The method of claim 1, wherein the canceling first quadrature error of the first sense information using a first summer and the demodulating the quadrature-corrected first sense information using a first multiplier includes using a first switch matrix including the first summer and the first multiplier.

* * * * *